US012635275B2

(12) United States Patent
Shirahige

(10) Patent No.: US 12,635,275 B2
(45) Date of Patent: May 19, 2026

(54) PHOTOELECTRIC CONVERSION DEVICE AND PHOTOELECTRIC CONVERSION SYSTEM

(71) Applicant: CANON KABUSHIKI KAISHA, Tokyo (JP)

(72) Inventor: Daiki Shirahige, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 496 days.

(21) Appl. No.: 18/329,383

(22) Filed: Jun. 5, 2023

(65) Prior Publication Data

US 2023/0395623 A1     Dec. 7, 2023

(30) Foreign Application Priority Data

Jun. 6, 2022     (JP) ................................. 2022-091513

(51) Int. Cl.
   *H10F 39/00*          (2025.01)
(52) U.S. Cl.
   CPC ...  *H10F 39/80373* (2025.01); *H10F 39/8023* (2025.01); *H10F 39/811* (2025.01)
(58) Field of Classification Search
   CPC ............................... H10F 39/199; H10F 39/95
   See application file for complete search history.

(56) References Cited

U.S. PATENT DOCUMENTS

2010/0032734 A1* 2/2010 Roy ...................... H10F 39/199
                                                     257/292
2017/0062506 A1    3/2017 Saito 2021/0084249 A1     3/2021 Nakazawa
2022/0021826 A1*    1/2022 Ejiri ........................ H04N 25/78
2022/0302192 A1*    9/2022 Yamakawa ......... H01L 21/3205
2022/0415948 A1    12/2022 Machida
2023/0013149 A1     1/2023 Akiyama
2024/0170507 A1*    5/2024 Yoshigiwa .......... H10F 39/8027

FOREIGN PATENT DOCUMENTS

JP       2019004007 A     1/2019
WO       2019130702 A1    7/2019
WO       2021084959 A1    5/2021
WO       2021117448 A1    6/2021

* cited by examiner

*Primary Examiner* — Benjamin P Sandvik
(74) *Attorney, Agent, or Firm* — Canon U.S.A., Inc. IP Division

(57)     ABSTRACT

A photoelectric conversion device includes a first substrate including, in a first semiconductor layer, a photoelectric conversion unit and a transfer transistor configured to transfer charges generated in the photoelectric conversion unit, a second substrate including, in a second semiconductor layer, a pixel circuit configured to output a signal based on the charges transferred from the transfer transistor, and a third substrate including, in a third semiconductor layer, a logic circuit configured to process the signal, wherein the first, second and third substrates are stacked in such a way that the second substrate is disposed between the first substrate and the third substrate, wherein the first substrate and the second substrate are electrically connected by a through wiring line penetrating through an insulator included in the second semiconductor layer, and wherein a plane orientation of the first semiconductor layer and a plane orientation of the second semiconductor layer are same.

15 Claims, 14 Drawing Sheets

SECOND CRYSTAL DIRECTION

*301*

FIRST CRYSTAL DIRECTION

*101*  *112*

*121*

SECOND CRYSTAL DIRECTION

FIRST CRYSTAL DIRECTION

SECOND CRYSTAL DIRECTION

*311*

FIRST CRYSTAL DIRECTION

*131*  *141*

*200a*  *250*  *151*

SECOND CRYSTAL DIRECTION

FIRST CRYSTAL DIRECTION (100) SUBSTRATE

< 100 >

< 100 >

(110) SUBSTRATE

< 100 >

< 110 >

SECOND CRYSTAL DIRECTION

301

FIRST CRYSTAL DIRECTION 101  111

121

SECOND CRYSTAL DIRECTION

FIRST CRYSTAL DIRECTION

SECOND CRYSTAL DIRECTION

311

FIRST CRYSTAL DIRECTION 131  141

151

SECOND CRYSTAL DIRECTION

FIRST CRYSTAL DIRECTION

SECOND CRYSTAL DIRECTION

321

FIRST CRYSTAL DIRECTION

261

SECOND CRYSTAL DIRECTION

FIRST CRYSTAL DIRECTION (100) SUBSTRATE (110) SUBSTRATE

PHOTOELECTRIC CONVERSION DEVICE AND PHOTOELECTRIC CONVERSION SYSTEM

BACKGROUND OF THE INVENTION

Technical Field

The aspect of the embodiments relates to a photoelectric conversion device and a photoelectric conversion system.

Description of the Related Art

To achieve higher density of pixels provided in a photoelectric conversion device, International Publication No. WO 2019/130702 discusses an example in which a photoelectric conversion unit is provided in a first semiconductor layer and a pixel circuit is provided in a second semiconductor layer. International Publication No. WO 2019/130702 discusses that the first semiconductor layer and the second semiconductor layer are stacked in a face-to-back manner to form a stacked body. International Publication No. WO 2019/130702 discusses that a third semiconductor layer including a logic circuit is stacked on the stacked body. International Publication No. WO 2019/130702 does not discuss plane orientations of silicon substrates of the first to third semiconductor layers.

SUMMARY OF THE INVENTION

According to an aspect of the embodiments, a photoelectric conversion device includes a first substrate including, in a first semiconductor layer, a photoelectric conversion unit and a transfer transistor configured to transfer charges generated in the photoelectric conversion unit, a second substrate including, in a second semiconductor layer, a pixel circuit configured to output a signal based on the charges transferred from the transfer transistor, and a third substrate including, in a third semiconductor layer, a logic circuit configured to process the signal, wherein the first substrate, the second substrate, and the third substrate are stacked in such a way that the second substrate is disposed between the first substrate and the third substrate, wherein the first substrate and the second substrate are electrically connected by a through wiring line penetrating through an insulator included in the second semiconductor layer, and wherein a plane orientation of the first semiconductor layer and a plane orientation of the second semiconductor layer are same as each other.

Further features of the disclosure will become apparent from the following description of exemplary embodiments with reference to the attached drawings.

DESCRIPTION OF THE EMBODIMENTS

Figure 1:
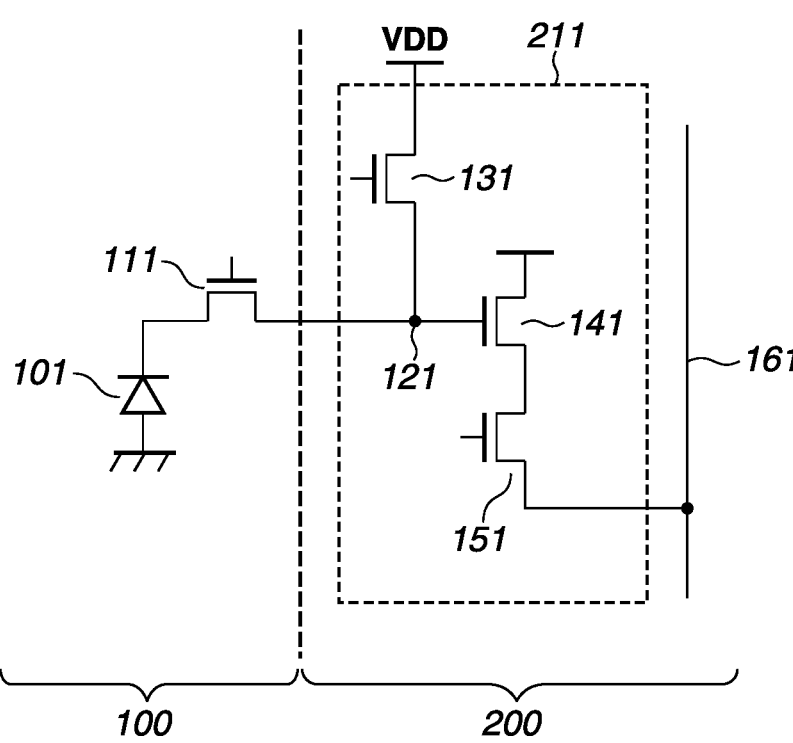
FIG. 1 is an equivalent circuit diagram of a pixel according to a first exemplary embodiment.

Exemplary embodiments to be described below are to embody the technical idea of the disclosure, and the disclosure is not limited to the exemplary embodiments. Sizes and positional relationships of members illustrated in drawings are exaggerated to make description clear in some cases. In the following description, the same components are denoted by the same reference numerals, and description of the components is omitted in some cases. Configurations to be described in the exemplary embodiments can be replaced with or combined with configurations to be described in other exemplary embodiments as long as it is technically possible.

Exemplary embodiments of the disclosure are to be described in detail with reference to drawings. In the following description, terms indicating specific directions and positions (e.g., "up", "down", "right", "left", and other terms including these terms) are used as necessary. These terms are used for easy understanding of the exemplary embodiments of the disclosure with reference to the drawings, and the meanings of these terms do not limit the technical scope of the disclosure. Even an upside-down configuration belongs to the technical scope of the disclosure.

An N type is described as an example of a first conductivity type, and a P type is described as an example of a second conductivity type, but the relationship may be reversed.

FIG. 1 is an equivalent circuit diagram of a photoelectric conversion unit and a pixel circuit according to a first exemplary embodiment, and is an equivalent circuit diagram of one pixel. The example of one pixel is illustrated, but a photoelectric conversion device includes a pixel region in which a plurality of pixels is provided in a matrix.

A photoelectric conversion unit (photodiode) 101 and a transfer transistor 111 are provided on a first substrate 100.

The photoelectric conversion unit 101 generates charges in response to incidence of light. The transfer transistor 111 is a transistor transferring the charges generated by the photoelectric conversion unit 101.

A cathode of the photoelectric conversion unit 101 is electrically connected to a source of the transfer transistor 111, and an anode of the photoelectric conversion unit 101 is electrically connected to a reference potential line (e.g., ground). A drain of the transfer transistor 111 is electrically connected to a floating diffusion 121, and a gate of the transfer transistor 111 is electrically connected to a pixel drive line (not illustrated).

The charges output from the photoelectric conversion unit 101 through the transfer transistor 111 are temporarily held by the floating diffusion 121.

A pixel circuit 211 includes, for example, a reset transistor 131, a selection transistor 151, and an amplifier transistor 141. The pixel circuit 211 is provided on a second substrate 200.

A gate of the reset transistor 131 is electrically connected to the pixel drive line (not illustrated). A source of the amplifier transistor 141 is electrically connected to a drain of the selection transistor 151, and a gate of the amplifier transistor 141 is electrically connected to a source of the reset transistor 131. A source of the selection transistor 151 (output end of pixel circuit 211) is electrically connected to an output line 161, and a gate of the selection transistor 151 is electrically connected to the pixel drive line (not illustrated).

When the transfer transistor 111 is turned on, the transfer transistor 111 transfers the charges of the photoelectric conversion unit (photodiode) 101 to the floating diffusion 121. As described with reference to FIG. 2, the gate (transfer gate) of the transfer transistor 111 is disposed on a surface of a semiconductor layer. Alternatively, the gate of the transfer transistor 111 may extend from the surface of the semiconductor layer to a depth reaching the photoelectric conversion unit 101. In other words, the gate of the transfer transistor 111 may be a vertical transfer gate.

The reset transistor 131 resets a potential of the floating diffusion 121 to a predetermined potential. When the reset transistor 131 is turned on, the reset transistor 131 resets the potential of the floating diffusion 121 to a potential of a power supply line VDD.

The selection transistor 151 controls a timing of outputting a pixel signal from the pixel circuit 211. The selection transistor 151 may be removed as necessary. The source of the reset transistor 131 (input end of pixel circuit 211) is electrically connected to the floating diffusion 121, and a drain of the reset transistor 131 is electrically connected to the power supply line VDD and a drain of the amplifier transistor 141.

The amplifier transistor 141 generates, as the pixel signal, a signal of a voltage corresponding to a level of the charges held by the floating diffusion 121. The amplifier transistor 141 is included in a source-follower amplifier, and outputs the pixel signal of the voltage corresponding to the level of the charges generated by the photoelectric conversion unit 101. When the selection transistor 151 is turned on, the amplifier transistor 141 amplifies the potential of the floating diffusion 121, and outputs a voltage corresponding to the potential to a column circuit (not illustrated) through the output line 161.

The selection transistor 151 may be provided between the power supply line VDD and the amplifier transistor 141. In this case, the drain of the reset transistor 131 is electrically connected to the power supply line VDD and the drain of the selection transistor 151. The source of the selection transistor 151 is electrically connected to the drain of the amplifier transistor 141, and the gate of the selection transistor 151 is electrically connected to the pixel drive line (not illustrated). The source of the amplifier transistor 141 is electrically connected to the output line 161, and the gate of the amplifier transistor 141 is electrically connected to the source of the reset transistor 131. A transistor FDG may be provided between the source of the reset transistor 131 and the gate of the amplifier transistor 141. The transistor FDG is used to switch conversion efficiency. The pixel signal is generally small in imaging in a dark place. When charge-to-voltage conversion is performed based on an equation Q=CV, in a case where a capacity (FD capacity C) of the floating diffusion 121 is large, the voltage V converted by the amplifier transistor 141 becomes small. In contrast, in a bright place, the pixel signal is large. Therefore, in a case where the FD capacity C is not large, the floating diffusion 121 cannot receive the charges of the photoelectric conversion unit 101. Further, it is necessary to increase the FD capacity C so as to prevent the voltage V converted by the amplifier transistor 141 from being excessively large (in other words, to reduce voltage V). In consideration of the foregoing, when the transistor FDG is turned on, the gate capacity is increased by an amount of the transistor FDG, and the entire FD capacity C is accordingly increased. In contrast, when the transistor FDG is turned off, the entire FD capacity C is reduced. As described above, switching on/off of the transistor FDG makes it possible to vary the FD capacity C and to switch the conversion efficiency.

Figure 2:
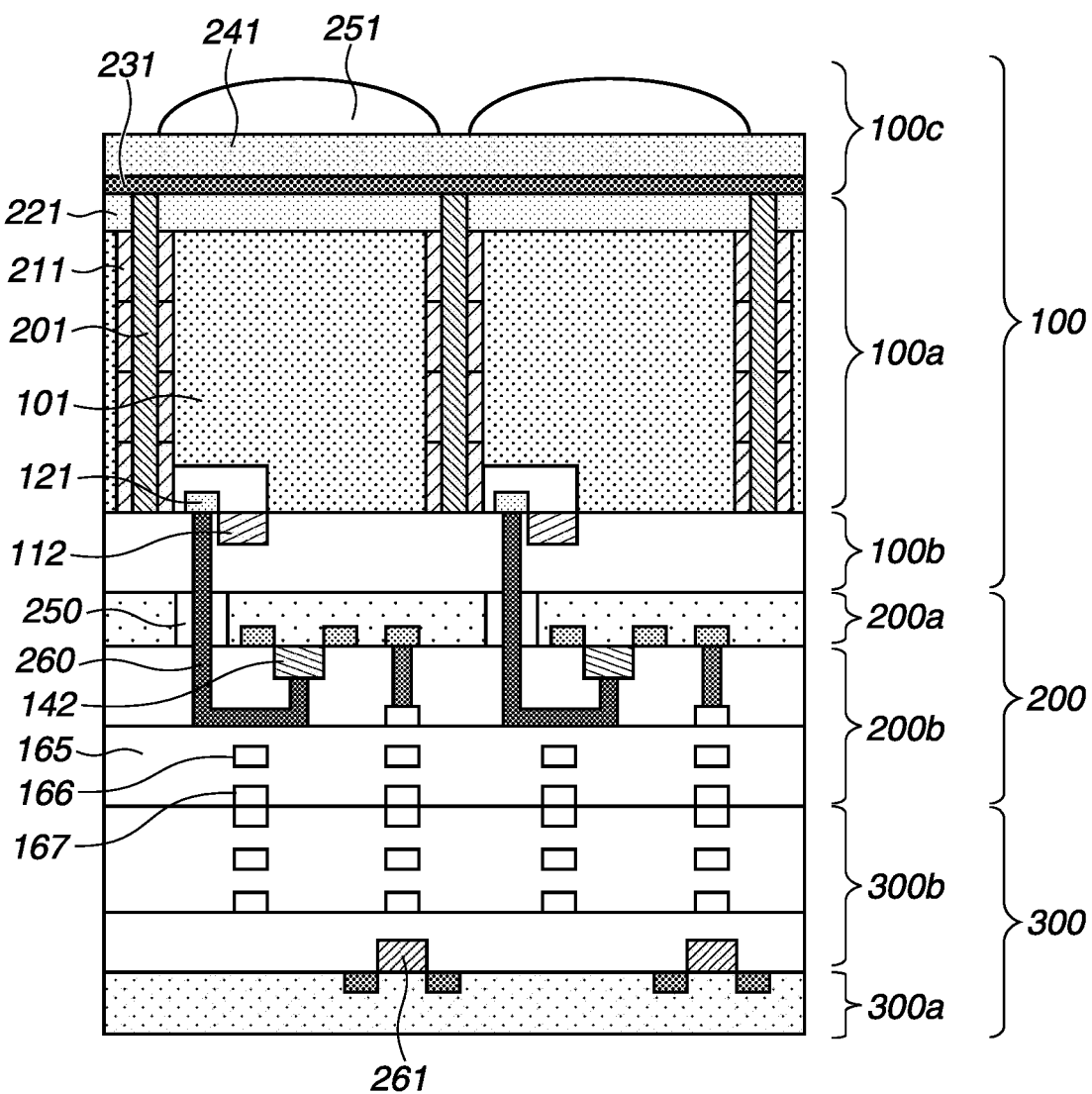
FIG. 2 is a pixel cross-sectional view according to the first exemplary embodiment.

FIG. 2 is a cross-sectional view of pixels according to the present exemplary embodiment. The first substrate 100, the second substrate 200, and a third substrate 300 are stacked in this order. In other words, the photoelectric conversion device has a structure in which the second substrate is provided between the first substrate 100 and the third substrate 300.

The first substrate 100 includes a first semiconductor layer 100a, a first wiring layer 100b, and a member 100c. The second substrate 200 is configured in such a way that the pixel circuit is provided on a portion on a front surface side (third substrate 300 side) of a second semiconductor layer 200a. The second substrate 200 is bonded to the first substrate 100 while a rear surface of the second semiconductor layer 200a faces a front surface side of the first semiconductor layer 100a. In other words, the second substrate 200 is bonded to the first substrate 100 in a face-to-back manner.

The second substrate 200 includes the second semiconductor layer 200a and a second wiring layer 200b. The second wiring layer 200b includes a plurality of insulation layers 165 and conductive layers 166 provided among the plurality of insulation layers 165. In FIG. 2, a reference numeral 166 is imparted to parts of the conductive layers in a second layer of the second wiring layer 200b, but the conductive layers are provided in a first layer of the second wiring layer 200b.

The third substrate 300 includes a third semiconductor layer 300a and a third wiring layer 300b. Likewise, the third wiring layer 300b includes a plurality of insulation layers and a plurality of conductive layers. An uppermost layer (lowermost layer in FIG. 2) of the second wiring layer 200b and an uppermost layer (uppermost layer in FIG. 2) of the third wiring layer 300b are provided with the insulation layers 165 and conductive layers 167. The conductive layers provided in the uppermost layers are also referred to as pad layers or pad electrodes. The electric conduction of the second wiring layer 200b and the third wiring layer 300b is secured by joining of the insulation layers and joining of the conductive layers. In other words, the second substrate 200 and the third substrate 300 are bonded in a face-to-face manner by hybrid joining.

Each of the semiconductor layers is made of, for example, monocrystalline silicon. Each of the insulation layers is made of, for example, silicon oxide (SiO). Each of the insulation layers may include a layer made of silicon carbide (SiC), silicon nitride (SiN), or the like in order to suppress metal diffusion from the conductive layers. Each of the conductive layers is made of a metal such as copper (Cu) and aluminum (Al). In particular, each of the conductive layers in the hybrid-joined uppermost layers is made of copper (Cu).

A barrier layer having a diffusion prevention function is appropriately provided around these metals.

(First Substrate: Photoelectric Conversion Unit Substrate)

The first substrate 100 includes the photoelectric conversion unit 101 in the first semiconductor layer 100a. More precisely, a first semiconductor region of the first conductivity type that is a part of the photodiode as the photoelectric conversion unit 101 is denoted by the reference numeral 101. The first semiconductor region is, for example, an N-type semiconductor region, and functions as the cathode of the photodiode as the photoelectric conversion unit 101. A second semiconductor region 211 of the second conductivity type (e.g., P-type semiconductor region) and a third semiconductor region 221 of the second conductivity type (e.g., P-type semiconductor region) are provided around the first semiconductor region. The second semiconductor region 211 of the second conductivity type (e.g., P-type semiconductor region) is a region provided to separate each pixel. The second semiconductor region 211 is supplied with a reference potential (e.g., ground), and functions as the anode of the photodiode as the photoelectric conversion unit 101. Although not illustrated in FIG. 2, a through wiring line is electrically connected to the second semiconductor region 211 to supply the reference potential.

(Second Substrate: Pixel Circuit Substrate)

A pixel isolation portion 201 is provided in the second semiconductor region 211 of the second substrate 200. The pixel isolation portion 201 is a deep trench isolation (DTI) provided to penetrate through the first semiconductor layer 100a. The DTI is formed by filling an opening penetrating through the first semiconductor layer 100a with an insulation film, a metal, or the like.

As the member 100c, a pinning layer 231, a planarization film 241, and a microlens 251 are provided. More specifically, the pinning layer 231 is provided on a rear surface side of the first semiconductor layer 100a. The pinning layer 231 is, for example, a negative fixed charge film. More specifically, the pinning layer 231 is made of hafnium oxide, zirconium oxide, aluminum oxide, titanium oxide, or tantalum oxide. When the negative fixed charge film excites holes on the rear surface side of the first semiconductor layer 100a, even if dark electrons are generated, it is possible to recombine the holes and the electrons, and to eliminate the electrons contributing to a noise signal. A color filter (not illustrated) can be provided between the pinning layer 231 and the microlens 251.

A through wiring line (not illustrated) is electrically connected to the gate 112 of the transfer transistor 111, and a predetermined voltage is applied to the gate 112 of the transfer transistor 111. As a result, the charges accumulated in the first semiconductor region are transferred to the floating diffusion 121. A through wiring line 260 is connected to the floating diffusion 121. The through wiring line 260 is electrically connected to a gate 142 of the amplifier transistor 141. More specifically, the through wiring line 260 is a contact electrode configured to penetrate through an interlayer insulation film configuring the first wiring layer 100b, an insulator 250 included in the second semiconductor layer 200a, and an interlayer insulation film included in the second wiring layer 200b. The insulator 250 is made by forming an opening in a part of the second semiconductor layer 200a and filling the opening with an insulation film. For example, the insulator 250 is a shallow trench isolation (STI). In FIG. 2, the through wiring line 260 is electrically connected to the gate 142 of the amplifier transistor 141 through the first layer of the second wiring layer 200b and the contact electrode.

The through wiring line 260 is provided in each pixel.

(Third Substrate: Logic Substrate)

A transistor 261 of a logic circuit is provided in the third semiconductor layer 300a of the third substrate 300. The transistor 261 of the logic circuit is a part of a circuit for processing the output signal from the pixel circuit 211 provided in the second substrate 200. The logic circuit includes, for example, a vertical drive circuit, a column signal processing circuit, a horizontal drive circuit, and a system control circuit. The logic circuit (more specifically, horizontal drive circuit) outputs an output voltage Vout of each pixel to outside. In the logic circuit, a low-resistance region made of silicide may be provided on, for example, a surface of an impurity diffusion region in contact with a source and a drain of the transistor 261. More specifically, silicide is formed using a self-aligned silicide (salicide) process of CoSi, NiSi, or the like.

For example, the vertical drive circuit sequentially selects a plurality of pixels row by row. For example, the column signal processing circuit performs correlated double sampling (CDS) processing on the pixel signal output from each of the pixels in the row selected by the vertical drive circuit. For example, the column signal processing circuit performs the CDS processing to extract a signal level of the pixel signal, and holds pixel data corresponding to a light receiving amount of each of the pixels. For example, the horizontal drive circuit sequentially outputs the pixel data held by the column signal processing circuit, to outside. For example, the system control circuit controls driving of each of the blocks (vertical drive circuit, column signal processing circuit, and horizontal drive circuit) in the logic circuit.

Figures 3A, 3B:
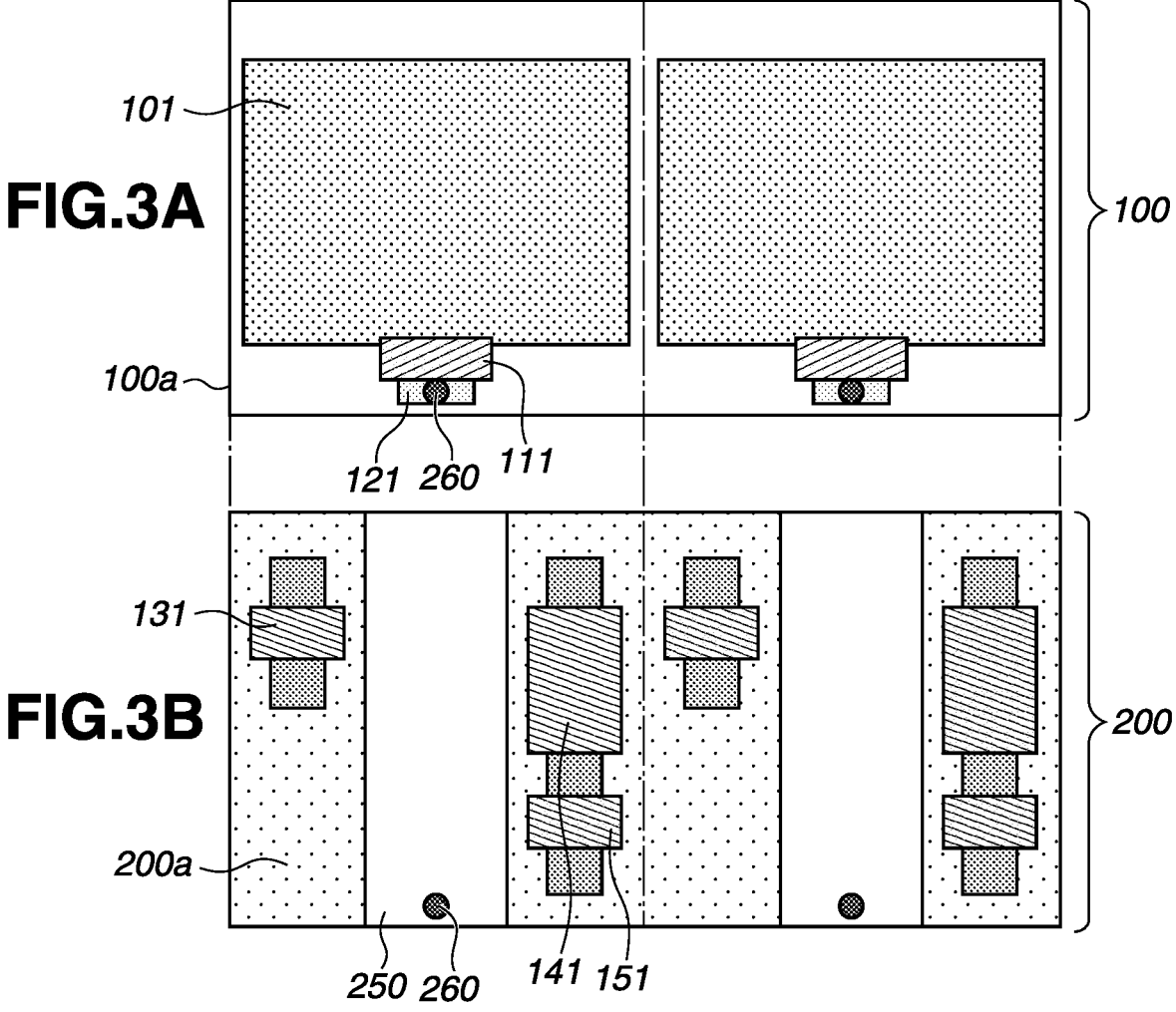
FIGS. 3A and 3B are plan views of a pixel circuit substrate according to the first exemplary embodiment.

FIG. 3A is a plan view illustrating the first semiconductor layer 100a and the first wiring layer 100b. Such a plan view is also referred to as a diagram in a planar view. FIG. 3B is a plan view illustrating the second semiconductor layer 200a and a part of the second wiring layer 200b.

The through wiring line 260 is provided on the floating diffusion 121 illustrated in FIG. 3A. As illustrated in FIG. 3B, the through wiring line 260 is configured to penetrate through the insulator 250 included in the second semiconductor layer 200a. Although not illustrated in FIG. 3B, the through wiring line 260 has a wiring structure electrically connected to the gate 142 of the amplifier transistor 141.

(Sharing Among Pixels)

Figure 4:
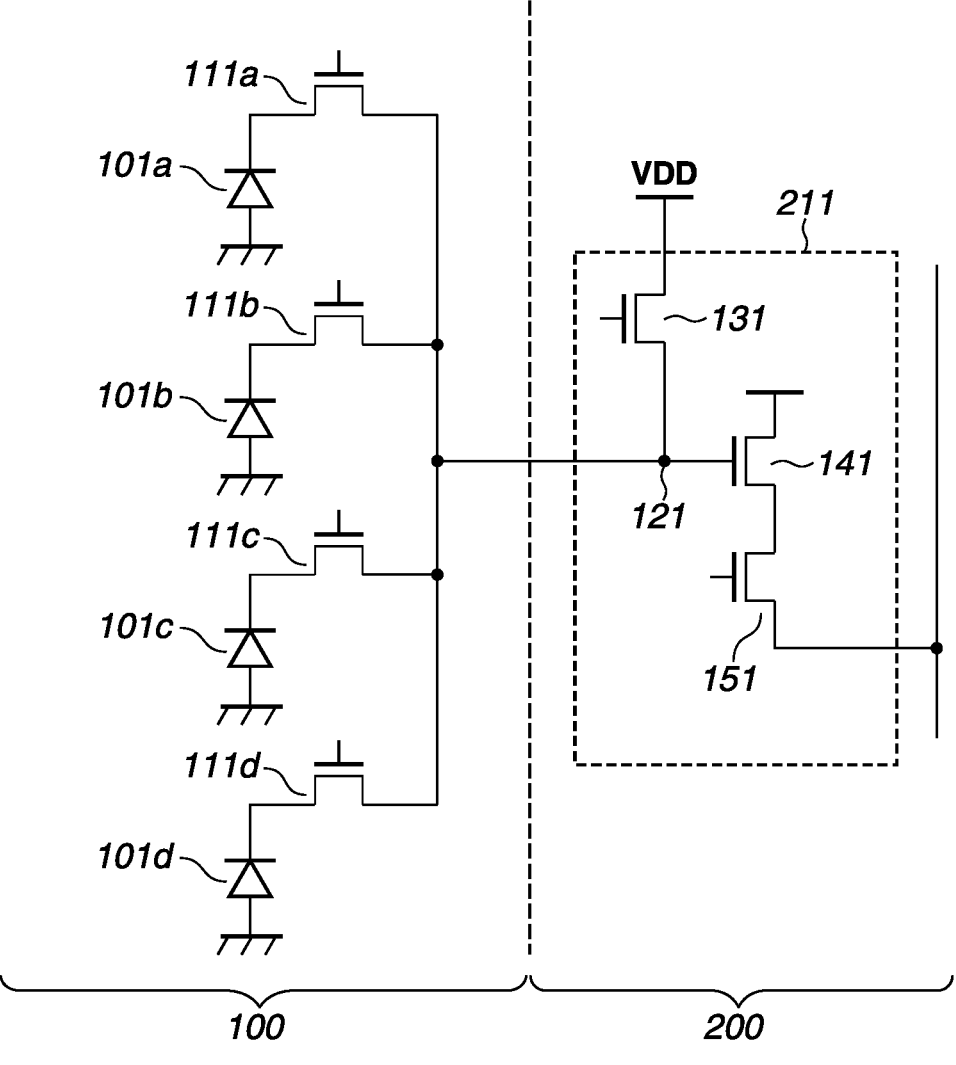
FIG. 4 is an equivalent circuit diagram of other pixels according to the first exemplary embodiment.

FIG. 4 is an equivalent circuit diagram for four pixels. An example in which the floating diffusions 121 of the plurality of photoelectric conversion units 101 are electrically connected to one another, and are electrically connected to an input end of the common pixel circuit 211 is illustrated. In FIG. 4, to distinguish the photoelectric conversion units 101 and the like corresponding to the respective pixels, suffixes a to d are imparted to reference numerals. Providing one pixel circuit 211 for the plurality of photoelectric conversion units 101 in this manner generates an advantage that an area occupied by the pixel circuit 211 in the entire photoelectric conversion device can be reduced.

Figure 5:
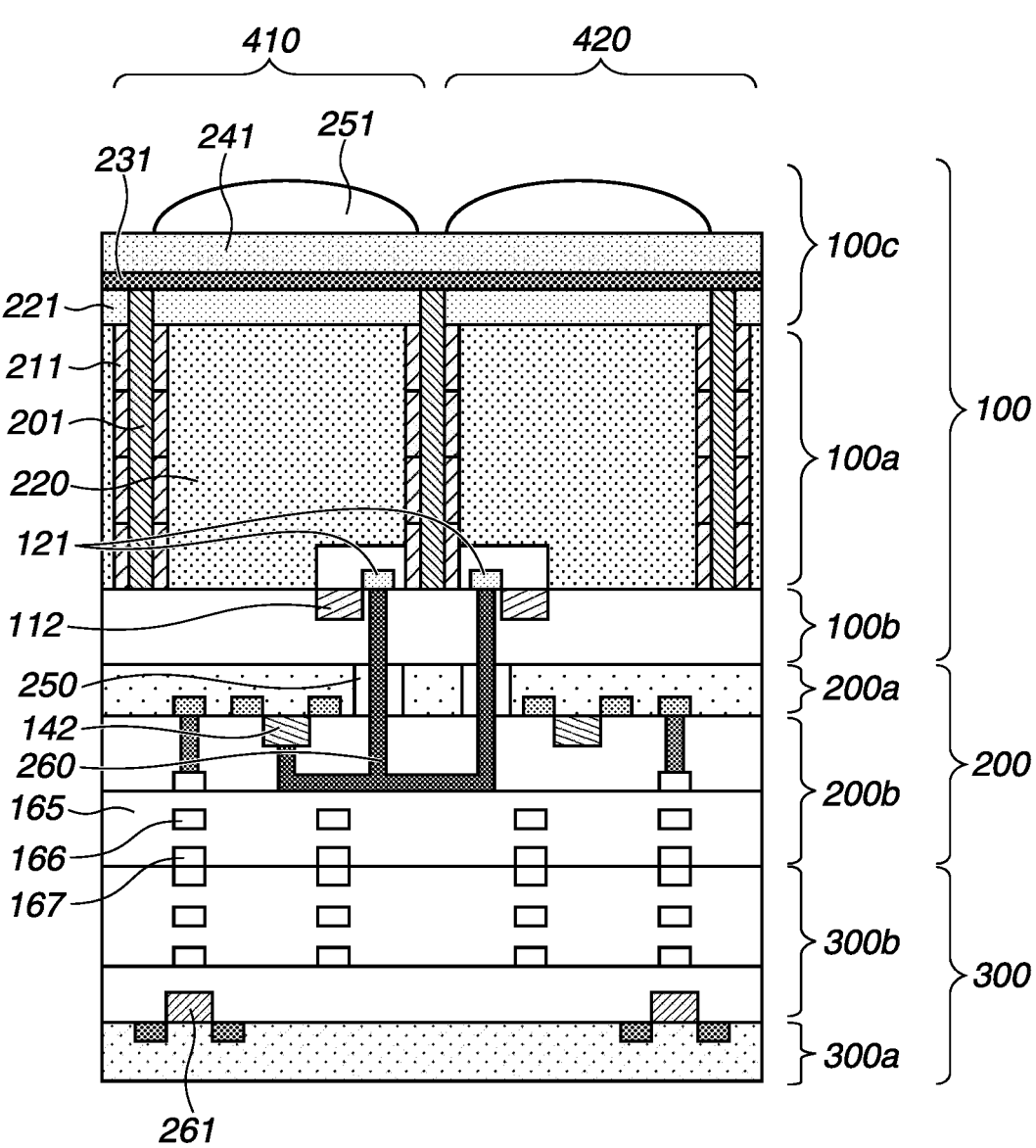
FIG. 5 is another cross-sectional view according to the first exemplary embodiment.

FIG. 5 is a pixel cross-sectional view corresponding to the equivalent circuit diagram illustrated in FIG. 4. FIG. 5 is a cross-sectional view for two pixels out of the four pixels.

The through wiring lines 260 are connected to the floating diffusion 121 of a first pixel 410 and the floating diffusion 121 of a second pixel 420. The two through wiring lines 260 are electrically connected to the gate 142 of the amplifier transistor 141 through the conductive layer provided in the first layer of the second wiring layer 200b.

Figures 6A, 6B:
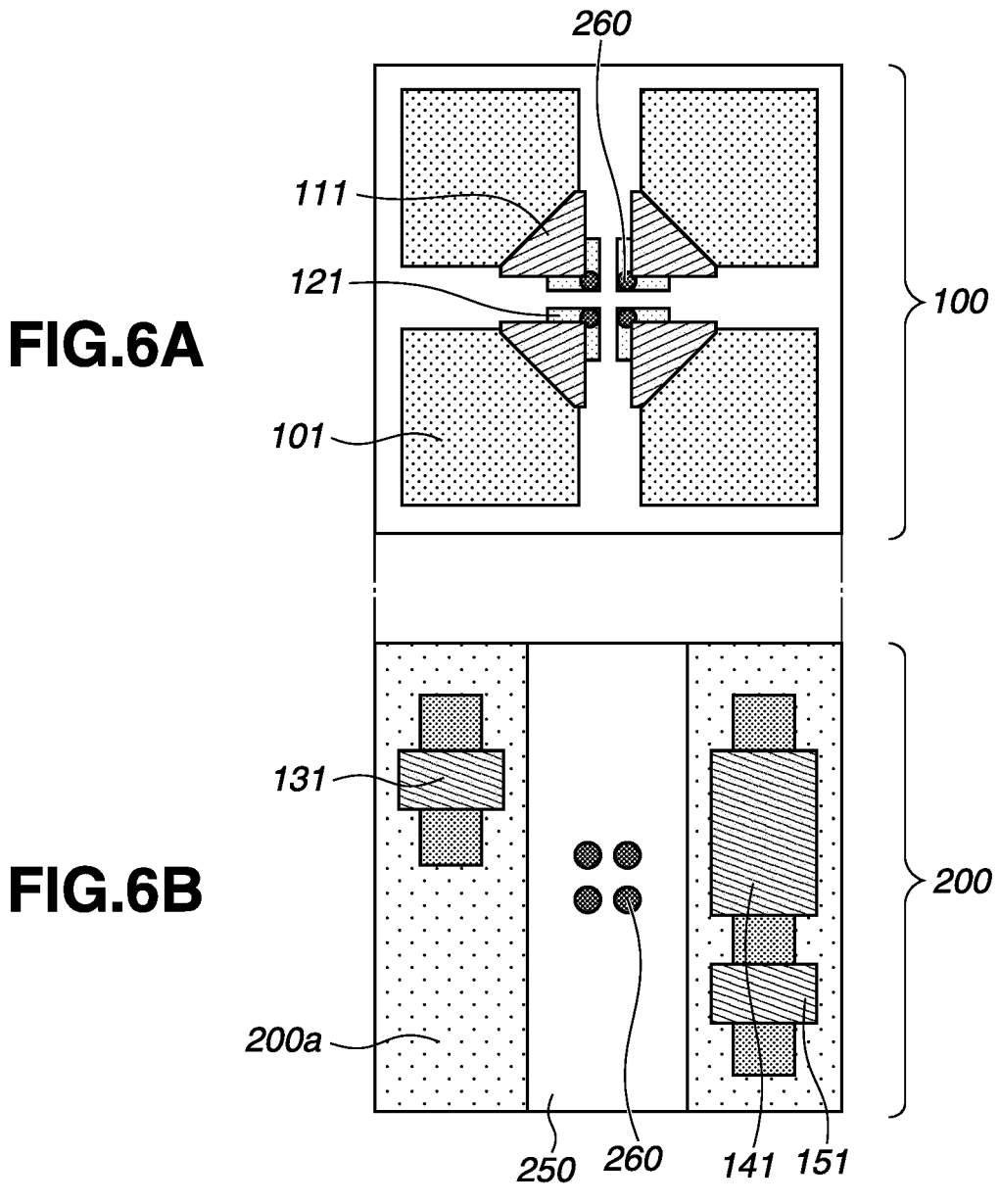
FIGS. 6A and 6B are plan views of another pixel circuit substrate according to the first exemplary embodiment.

FIGS. 6A and 6B are plan views corresponding to the equivalent circuit diagram illustrated in FIG. 4. FIG. 6A is a plan view illustrating the first semiconductor layer 100a and the first wiring layer 100b. FIG. 6B is a plan view illustrating the second semiconductor layer 200a and a part of the second wiring layer 200b. As illustrated in FIG. 6A, the floating diffusions 121 of the four pixels are collectively arranged at a center part, and the through wiring lines 260 are connected to the respective floating diffusions 121. As illustrated in FIG. 6B, the four through wiring lines 260 are provided so as to penetrate through the insulator 250. Although not illustrated, the four through wiring lines 260 are electrically connected to the amplifier transistor 141.

(Plane Orientation of Semiconductor Substrate)

Figure 7:
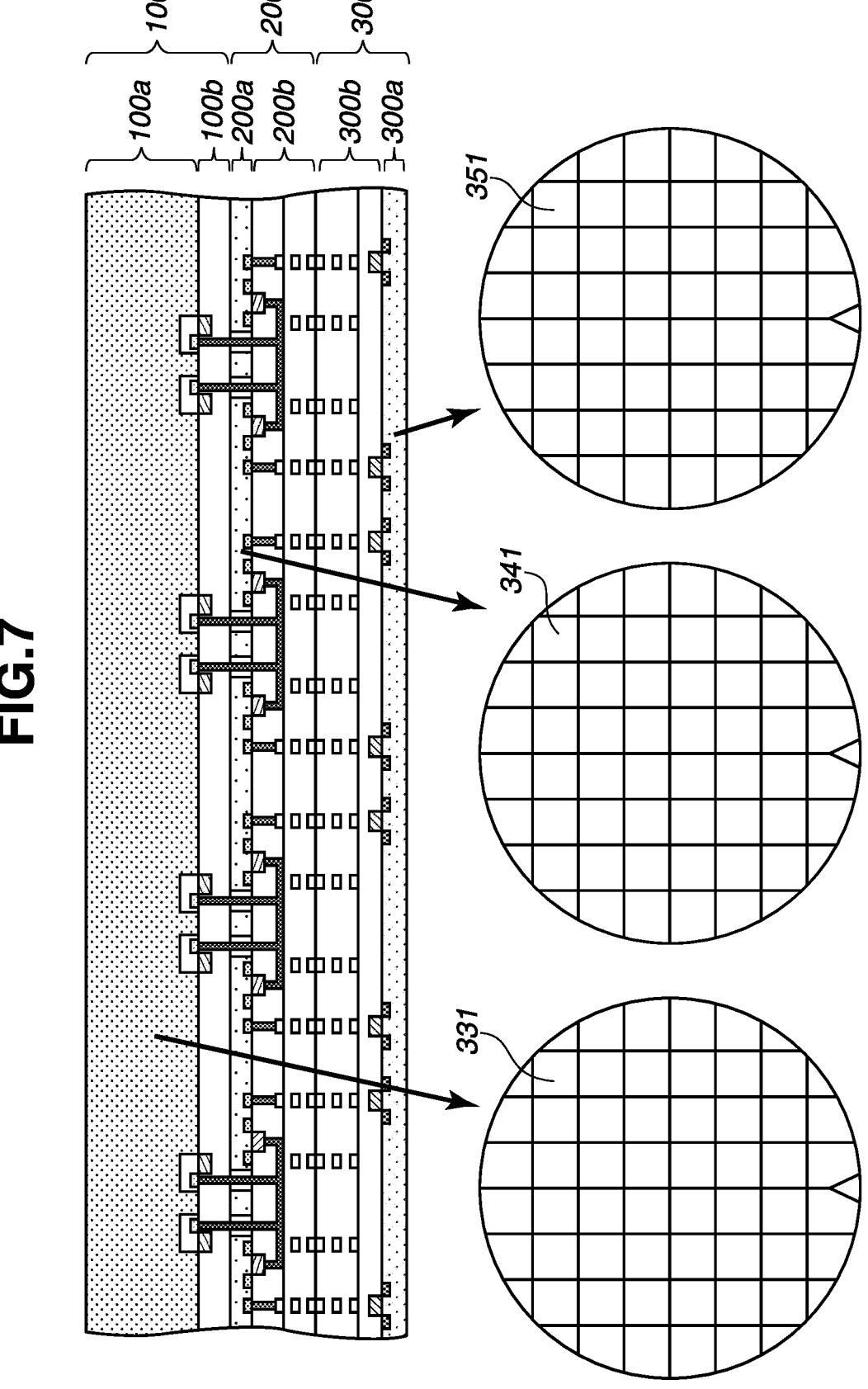
FIG. 7 is a cross-sectional view and an explanatory diagram of a photoelectric conversion device according to the first exemplary embodiment.

FIG. 7 is a cross-sectional view of the first substrate 100, the second substrate 200, and the third substrate 300. In the present exemplary embodiment, plane orientations of silicon crystals of the first semiconductor layer 100a, the second semiconductor layer 200a, and the third semiconductor layer 300a are the same.

For example, in a case where the plane orientation of a silicon wafer 301 (corresponding to first semiconductor layer 100a) is (100), the plane orientation of a silicon wafer 311 (corresponding to second semiconductor layer 200a) is (100). The fact that the plane orientation of the silicon wafer is (100) indicates that principal surfaces (front surface and rear surface) of the silicon wafer are parallel to a (100) plane based on plane indices of Miller indices of a silicon crystal. In this case, a plane orientation of a silicon wafer 321 (corresponding to third semiconductor layer 300a) is (100).

Likewise, in a case where the plane orientation of the silicon wafer 301 is (110), the plane orientation of the silicon wafer 311 is (110), and the plane orientation of the silicon wafer 321 is (110).

As described above, the plane orientations of the silicon crystals of the first semiconductor layer 100a and the second semiconductor layer 200a are made the same, which makes it possible to suppress generation of stress at the time of bonding. In particular, this is advantageous because the insulator 250 is provided in the second semiconductor layer 200a in order to provide the through wiring line 260, and the stress is easily generated near the insulator 250. When the stress is generated at the time of bonding, the first substrate 100 including the first semiconductor layer 100a is distorted. As a result, a band gap may become narrow, and the dark current may be increased. Adopting the above-described configuration makes it possible to suppress generation of the stress at the time of bonding, and to suppress generation of the dark current.

Among the first semiconductor layer 100a, the second semiconductor layer 200a, and the third semiconductor layer 300a, a thickest layer is the third semiconductor layer 300a. Therefore, the stress generated in the first semiconductor layer 100a and the second semiconductor layer 200a is caused by difference in expansion/contraction with the third semiconductor layer 300a. For this reason, the plane orientation of the third semiconductor layer 300a is made the same as the plane orientations of the first semiconductor layer 100a and the second semiconductor layer 200a, which makes it possible to suppress generation of the stress between the third semiconductor layer 300a and the first semiconductor layer 100a and between the third semiconductor layer 300a and the second semiconductor layer 200a.

Notches of the silicon wafers 301, 311, and 321 are aligned to make it possible to suppress distortion at the time of bonding and to suppress the dark current.

FIGS. 8A to 8D illustrate directions of the silicon wafers 301 and 311 and directions of the semiconductor elements of the first substrate 100 and the second substrate 200. In other words, FIGS. 8A to 8D illustrate the directions of the photoelectric conversion unit 101 (first semiconductor region), the transfer transistor 111, and the floating diffusion 121, and directions of the transistors configuring the pixel circuit 211.

Figures 8A, 8B, 8C, 8D:
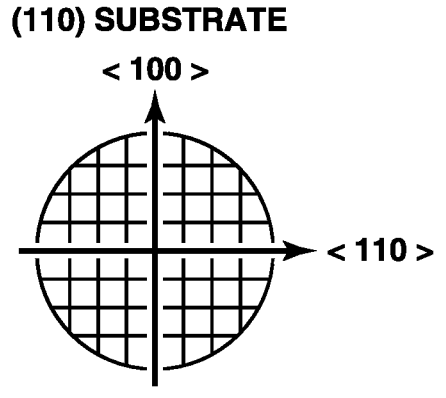
FIGS. 8A to 8D are plan views of a photoelectric conversion unit substrate and a pixel circuit substrate according to the first exemplary embodiment.

In FIGS. 8A and 8B, directions of arrows of the wafers 301 and 311 indicate crystal directions. In other words, the crystal directions perpendicular to a crystal plane are illustrated. For example, in a case of a (100) substrate having a plane orientation of (100), a first crystal direction is a <100> direction, and a second crystal direction is a <100> direction as illustrated in FIG. 8C. Each crystal direction indicates a direction perpendicular to a specific crystal plane. In a case where a (110) substrate has a plane orientation of (110), the first crystal direction is a <110> direction, and the second crystal direction is a <100> direction as illustrated in FIG. 8D.

FIGS. 8A and 8B illustrate the directions of the semiconductor elements. In a case of such directions, the wafer 301 and the wafer 311 are bonded such that the first crystal directions of the wafer 301 and the wafer 311 are coincident with each other, and that the second crystal directions of the wafer 301 and the wafer 311 are coincident with each other. As a result, the plane orientations of the wafers are aligned, and the crystal directions are also aligned. This makes it possible to suppress generation of the stress at the time of bonding.

In the above description, a direction in which the source and the drain of the transfer transistor 111 provided in the first semiconductor layer 100a are arranged is the second crystal direction, but such a direction may be the first crystal direction.

An angle formed by the direction in which the source and the drain of the transfer transistor 111 are arranged and the first or second crystal direction may be 0 degrees or more and 15 degrees or less. In a case where the angle formed by the two directions is neither 0 degrees nor 90 degrees, the angle may be an acute angle or an obtuse angle. In the present specification, the acute angle is constantly focused. In other words, the angle formed by the two directions is defined within a range of 0 degrees or more to 90 degrees or less. The angle does not have a negative value, and constantly has a positive value. The range of 0 degrees or more and 15 degrees or less is typically a range of 0 degrees or more and 10 degrees or less, and more typically 0 degrees.

A direction in which the source and the drain of each of the transistors included in the pixel circuit 211 provided in the second semiconductor layer 200a are arranged is the second crystal direction, but such a direction may be the first crystal direction.

An angle formed by the direction in which the source and the drain of each of the transistors included in the pixel circuit 211 are arranged and the first or second crystal direction may be 0 degrees or more and 15 degrees or less. The angle is typically 0 degrees or more and 10 degrees or less, and more typically 0 degrees.

US 12,635,275 B2

9
10

Figures 9A, 9B, 9C:
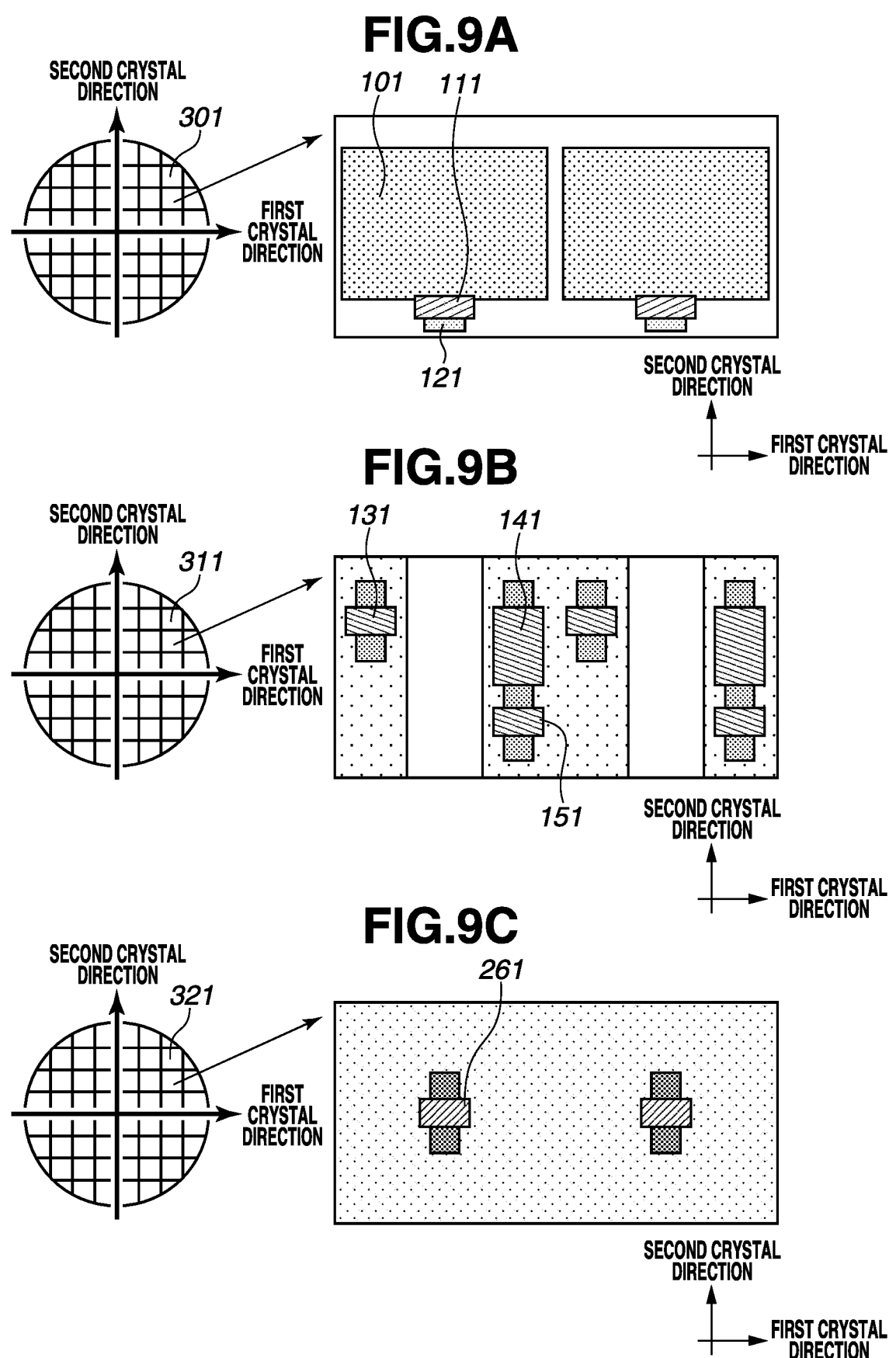
FIGS. 9A to 9C are plan views of the photoelectric conversion unit substrate, the pixel circuit substrate, and a logic substrate according to the first exemplary embodiment.

FIGS. 9A to 9C illustrate the directions of the silicon wafers 301, 311, and 321, and the directions of semiconductor elements of the first substrate 100, the second substrate 200, and the third substrate 300. FIGS. 9A to 9C are different from FIGS. 8A to 8D in that an arrangement example of the transistor 261 of the logic circuit is added as illustrated in FIG. 9C. In the arrangement example as illustrated in FIGS. 9A to 9C, the wafer 301, the wafer 311, and the wafer 321 are bonded such that the first crystal directions of the wafer 301, the wafer 311, and the wafer 321 are coincident with each other, and that the second crystal directions of the wafer 301, the wafer 311, and the wafer 321 are coincident with each other. As a result, the plane orientations of the wafers are aligned, and the crystal directions are also aligned. As a result, it is possible to suppress generation of the stress at the time of bonding.

A photoelectric conversion device according to a second exemplary embodiment is described with reference to FIG. 10 and FIGS. 11A to 11D.

Figure 10:
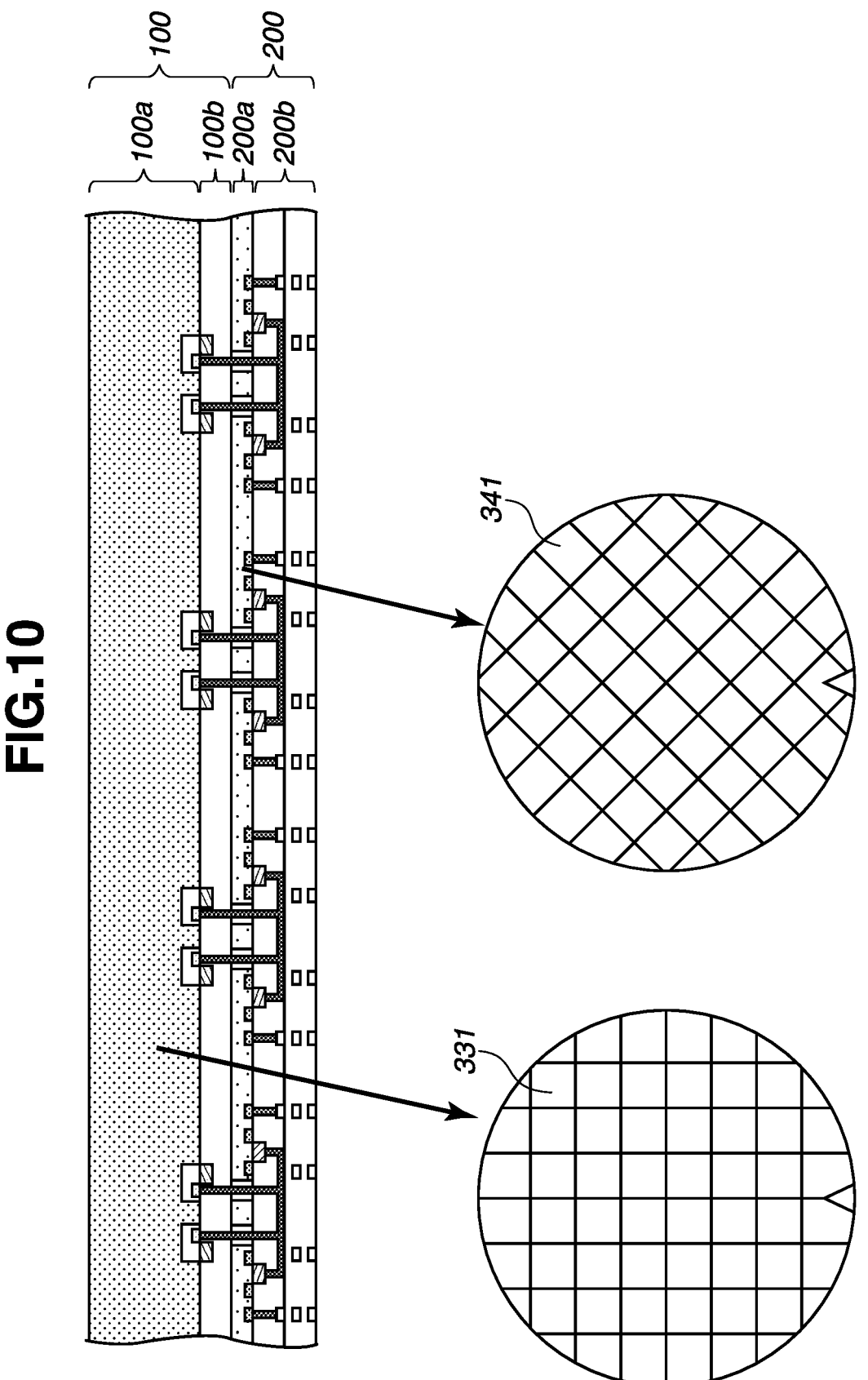
FIG. 10 is a cross-sectional view and an explanatory diagram of a photoelectric conversion device according to a second exemplary embodiment.

FIG. 10 illustrates a wafer 331 used for the first semiconductor layer 100a and a wafer 341 used for the second semiconductor layer 200a.

In the present exemplary embodiment, as in the first exemplary embodiment, plane orientations of the wafer 331 and the wafer 341 are aligned. For example, in a case where the plane orientation of the wafer 331 is (100), the plane orientation of the wafer 341 is also (100). For example, in a case where the plane orientation of the wafer 331 is (110), the plane orientation of the wafer 341 is also (110).

On the other hand, the present exemplary embodiment is different from the first exemplary embodiment in that, when the wafer 331 and the wafer 341 are bonded to each other, the wafer 341 is rotated relative to the wafer 331 to change the crystal directions. For example, as illustrated in FIG. 10, the wafer 341 is bonded to the wafer 331 while being inclined rightward by 45 degrees around a wafer center.

FIGS. 11A to 11D illustrate directions of the silicon wafers 331 and 341, and the directions of the semiconductor elements of the first substrate 100 and the second substrate 200. In other words, FIGS. 11A to 11D illustrate the directions of the photoelectric conversion unit 101 (first semiconductor region), the transfer transistor 111, and the floating diffusion 121, and the directions of the transistors included in the pixel circuit 211.

Figures 11A, 11B, 11C, 11D:
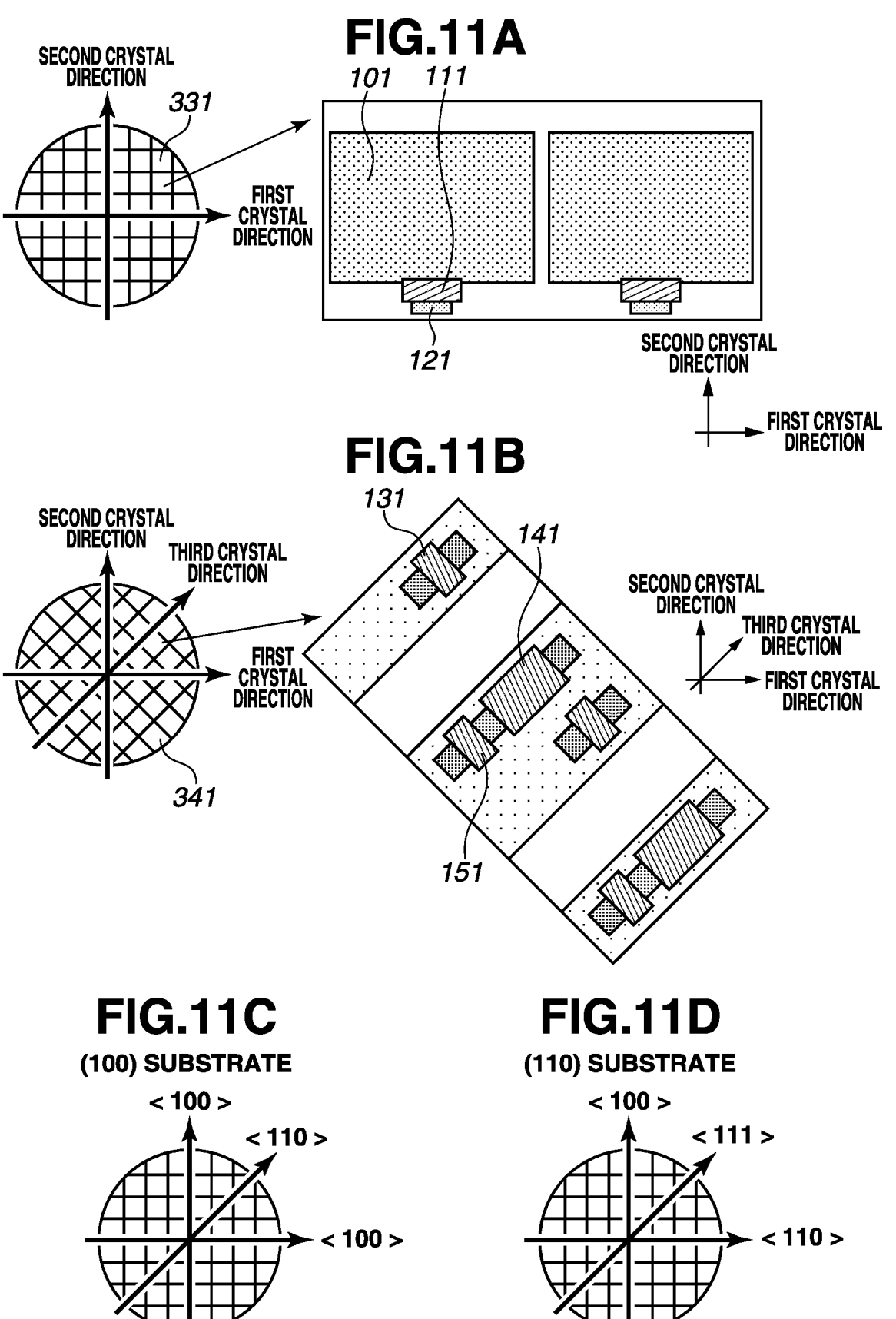
FIGS. 11A to 11D are plan views of a photoelectric conversion unit substrate and a pixel circuit substrate according to the second exemplary embodiment.

As in FIGS. 8A and 8B, directions of arrows of the wafers 331 and 341 in FIGS. 11A and 11B indicate crystal directions. For example, in the case of the (100) substrate having the plane orientation of (100), the first crystal direction is the <100> direction, and the second crystal direction is the <100> direction as illustrated in FIG. 11C. In the case of the (110) substrate having the plane orientation of (110), the first crystal direction is the <110> direction, and the second crystal direction is the <100> direction as illustrated in FIG. 11D.

In the wafer 341 in FIG. 11B, a third crystal direction is illustrated, unlike FIG. 8B. To describe the first to third crystal directions, FIGS. 11C and 11D are used. In the case of the (100) substrate illustrated in FIG. 11C, the third crystal direction is <110>. In the case of the (110) substrate illustrated in FIG. 11D, the third crystal direction is <111>.

In the case of the directions of the semiconductor elements in FIGS. 11A and 11B, the wafer 331 and the wafer 341 are bonded in such a way that the second crystal direction of the wafer 331 and the third crystal direction of the wafer 341 are coincident with each other. In other words, the wafer 341 is rotated leftward by 45 degrees around the wafer center, and is then bonded to the wafer 331.

In the second semiconductor layer 200a (wafer 341) provided with the pixel circuit 211, in one embodiment, crystal directions of the silicon crystal are present in order to operate the transistors included in the pixel circuit 211 at high speed. Accordingly, in consideration of characteristics of the transistors for the pixel circuit 211, the source or the drain of each of the transistors is disposed in the third crystal direction as illustrated in FIG. 11B. For this reason, as with the above-described configuration, the wafer 341 is rotated and bonded to the wafer 331.

As for the second semiconductor layer 200a, the example in which the angle formed by the first crystal direction and the direction in which the source and the drain of each of the transistors are arranged is 45 degrees is described above, but the angle may be more than 30 degrees and less than 60 degrees. The angle may be more than 40 degrees and less than 50 degrees.

The transfer transistor 111 provided in the first semiconductor layer 100a may have a configuration similar to the configuration described in the first exemplary embodiment.

According to the present exemplary embodiment, the plane orientations of the silicon crystals of the first semiconductor layer 100a and the second semiconductor layer 200a are made the same, which makes it possible to suppress generation of the stress at the time of bonding. It is also possible to improve the characteristics of the transistors of the pixel circuit 211 provided in the second semiconductor layer 200a.

A photoelectric conversion device according to a third exemplary embodiment is to be described with reference to FIG. 12 and FIGS. 13A to 13C.

Figure 12:
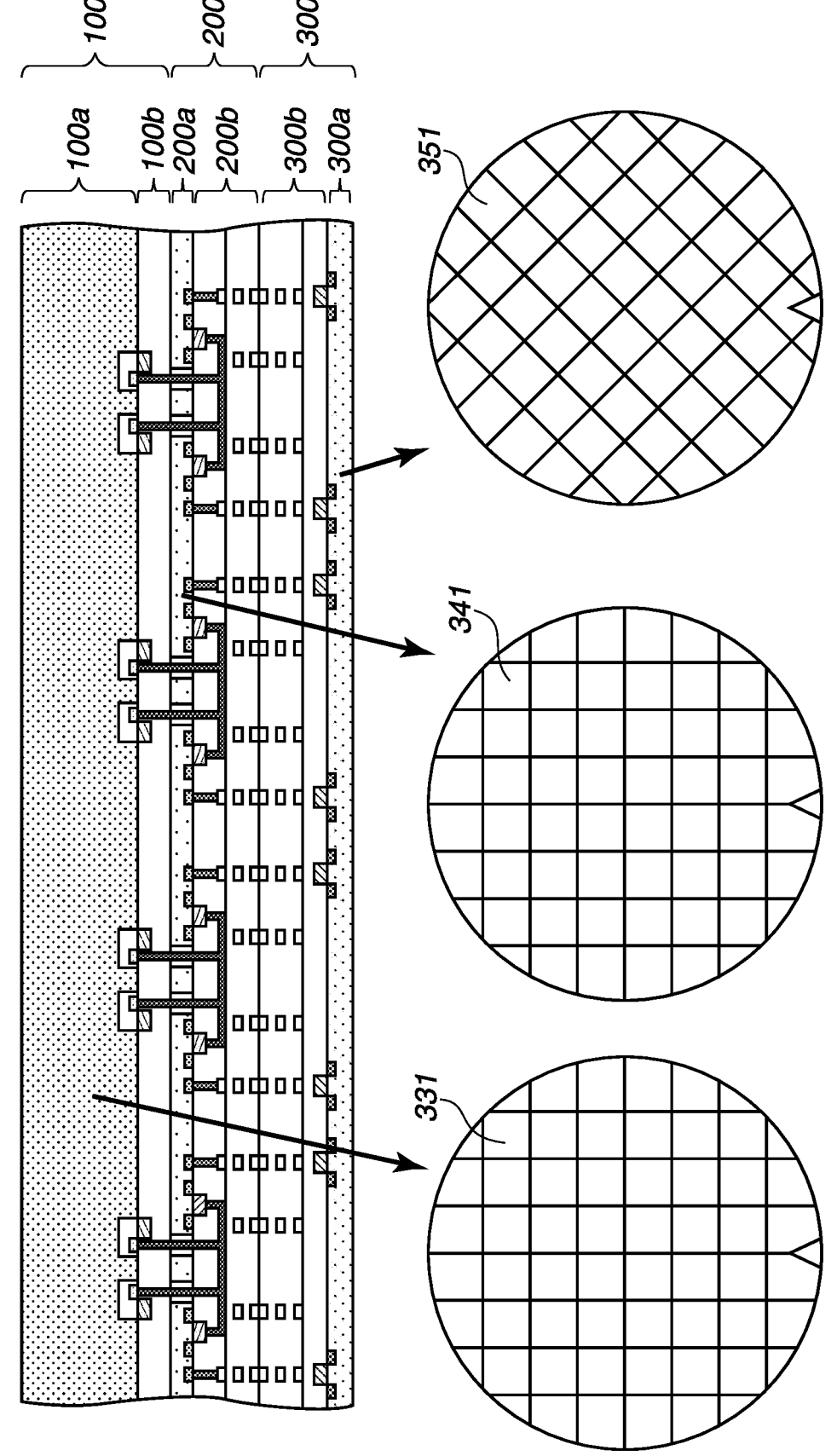
FIG. 12 is a cross-sectional view and an explanatory diagram of a photoelectric conversion device according to a third exemplary embodiment.

FIG. 12 is a cross-sectional view of the first substrate 100, the second substrate 200, and the third substrate 300. In the present exemplary embodiment, the plane orientations of the silicon crystals of the first semiconductor layer 100a, the second semiconductor layer 200a, and the third semiconductor layer 300a are the same. The wafer 331 is used for the first semiconductor layer 100a, the wafer 341 is used for the second semiconductor layer 200a, and a wafer 351 is used for the third semiconductor layer 300a.

As illustrated in FIG. 12, the wafer 331 and the wafer 341 are bonded in such a way that the crystal directions are coincident with each other, whereas the wafer 351 is bonded in such a way that the crystal directions are not coincident with the crystal directions of the wafers 331 and 341.

In the second exemplary embodiment, in consideration of the characteristics of the transistors included in the pixel circuit 211, the wafers are bonded in such a way that the crystal directions of the second semiconductor layer 200a and the crystal directions of the first semiconductor layer 100a are different from each other. On the other hand, in the present exemplary embodiment, in consideration of the characteristics of the transistor of the logic circuit provided in the third semiconductor layer 300a, the wafers are bonded in such a way that the crystal directions of the third semiconductor layer 300a and the crystal directions of the first semiconductor layer 100a are different from each other.

Figures 13A, 13B, 13C:
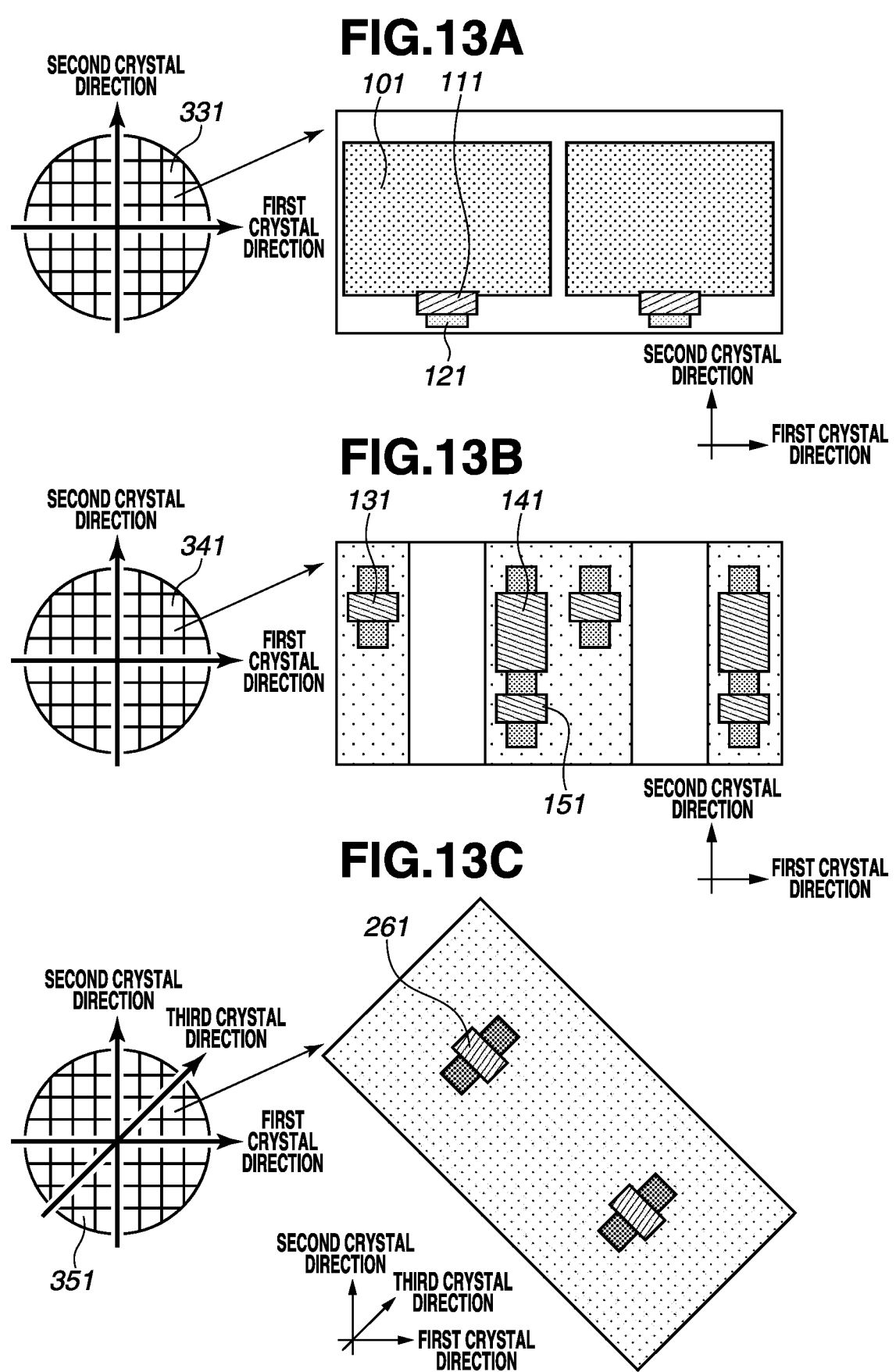
FIGS. 13A to 13C are plan views of a photoelectric conversion unit substrate, a pixel circuit substrate, and a logic substrate according to the third exemplary embodiment.

More specifically, as illustrated in FIG. 13C, the direction in which the source and the drain of the transistor of the logic circuit provided in the third semiconductor layer 300a are arranged is the third crystal direction.

An angle formed by the first crystal direction of the wafer 351 and the arrangement direction of the source and the drain of the transistor of the logic circuit is degrees.

As for the third semiconductor layer 300a, the example in which the angle formed by the first crystal direction and the direction in which the source and the drain of the transistor are arranged is 45 degrees is described, but the angle may be more than 30 degrees and less than 60 degrees. The angle may be more than 40 degrees and less than degrees.

According to the present exemplary embodiment, the plane orientations of the silicon crystals of the first semiconductor layer 100a, the second semiconductor layer 200a, and the third semiconductor layer 300a are made the same, which makes it possible to suppress generation of the stress at the time of bonding. It is also possible to improve the characteristics of the transistor of the logic circuit provided in the third semiconductor layer 300a.

In the present exemplary embodiment, the angle formed by the direction in which the source and the drain of the transistor of the logic circuit are arranged and the first crystal direction of the wafer is set to more than 30 degrees and less than 60 degrees. In addition, the angle formed by the direction in which the source and the drain of each of the transistors of the pixel circuit are arranged and the first crystal direction of the wafer may be set to more than 30 degrees and less than 60 degrees. This configuration also makes it possible to improve the characteristics of the transistors of the pixel circuit 211 provided in the second semiconductor layer 200a.

Figure 14A:
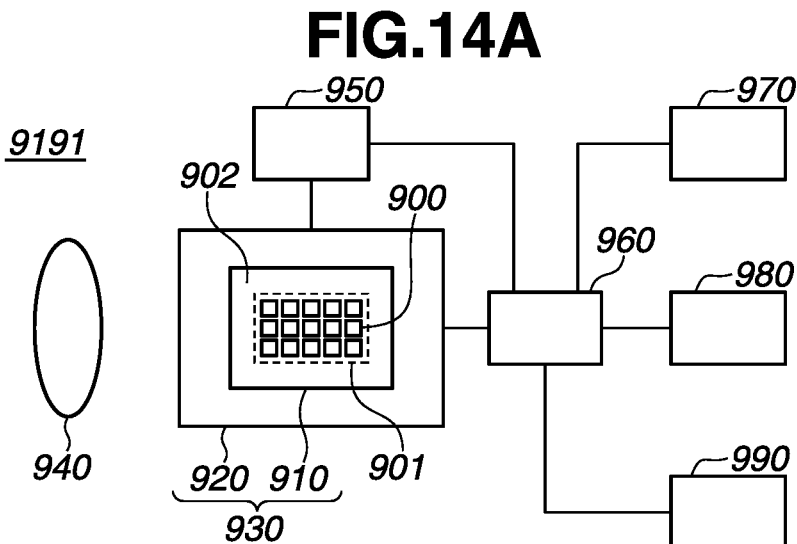
FIGS. 14A to 14C are diagrams illustrating configurations of apparatuses according to a fourth exemplary embodiment.
Figure 14B:
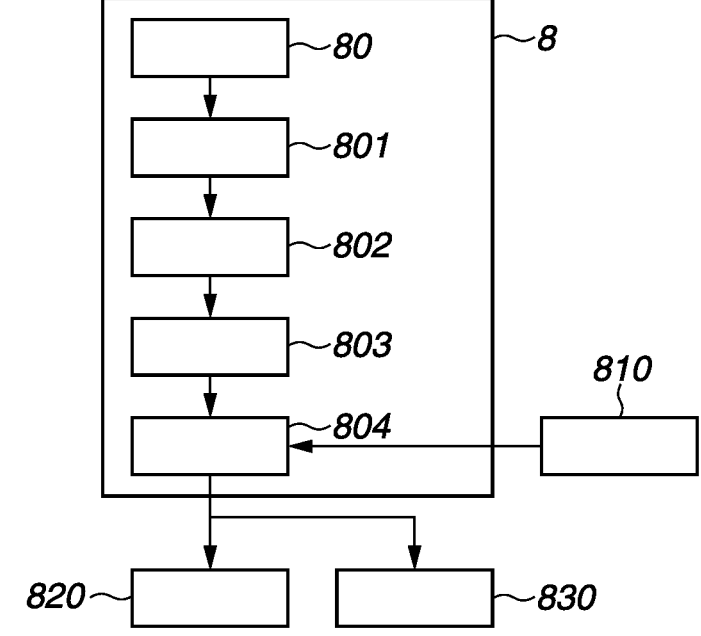
Figure 14C:
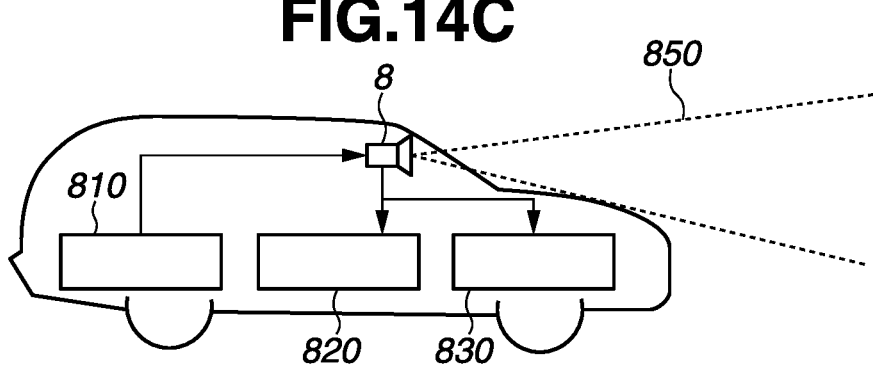

FIGS. 14A to 14C are diagrams illustrating apparatuses according to a fourth exemplary embodiment. The present exemplary embodiment is applicable to any of the above-described exemplary embodiments. FIG. 14A is a schematic diagram illustrating an apparatus 9191 including a semiconductor device 930 according to the present exemplary embodiment. The photoelectric conversion device according to any of the above-described exemplary embodiments can be used for the semiconductor device 930. The apparatus 9191 including the semiconductor device 930 is to be described in detail. As described above, the semiconductor device 930 can include, in addition to a semiconductor device 910 including a semiconductor layer 10, a package 920 housing the semiconductor device 910. The package 920 can include a base to which the semiconductor device 910 is fixed, and a lid made of glass or the like facing the semiconductor device 910. The package 920 can further include a joining member connecting a terminal provided on the base and a terminal provided on the semiconductor device 910, for example, a bonding wire and a bump.

The apparatus 9191 can include at least any of an optical device 940, a control device 950, a processing device (signal processing unit) 960, a display device 970, a storage device 980, and a machine device 990. The optical device 940 corresponds to the semiconductor device 930. The optical device 940 includes, for example, a lens, a shutter, and a mirror. The control device 950 controls the semiconductor device 930. The control device 950 is, for example, a semiconductor device such as application specific integrated circuits (ASIC).

The processing device 960 processes a signal output from the semiconductor device 930. The processing device 960 is a semiconductor device included in an analog front end (AFE) or a digital front end (DFE), such as a central processing unit (CPU) and ASIC. The display device 970 is an electroluminescence (EL) display device or a liquid crystal display device displaying information (image) obtained by the semiconductor device 930. The storage device 980 is a magnetic device or a semiconductor device storing the information (image) obtained by the semiconductor device 930. The storage device 980 is a volatile memory such as a static random access memory (SRAM) and a dynamic random access memory (DRAM), or a nonvolatile memory such as a flash memory and a hard disk drive.

The machine device 990 includes a movable unit or a propulsion unit such as a motor and an engine. In the apparatus 9191, the signal output from the semiconductor device 930 is displayed on the display device 970, and is transmitted to outside by a communication device (not illustrated) provided in the apparatus 9191. Accordingly, in one embodiment, the apparatus 9191 further includes the storage device 980 and the processing device 960 separately from a storage circuit and a calculation circuit held by the semiconductor device 930. The machine device 990 may be controlled based on the signal output from the semiconductor device 930.

The apparatus 9191 is suitable for an electronic apparatus such as an information terminal including an imaging function (e.g., smartphone and wearable terminal), and a camera (e.g., lens interchangeable camera, compact camera, video camera, and monitoring camera). The machine device 990 in the camera can drive parts of the optical device 940 to perform zooming, focusing, and shutter operation. Alternatively, the machine device 990 in the camera can move the semiconductor device 930 to perform vibration-proofing operation.

The apparatus 9191 may be a transportation apparatus such as a vehicle, a vessel, and an air vehicle. The machine device 990 in the transportation apparatus may be used as a moving device. The apparatus 9191 as the transportation apparatus is suitable for transporting the semiconductor device 930, and performing assistance and/or automation of operation (steering) by an imaging function. The processing device 960 for assistance and/or automation of operation (steering) can perform processing for operating the machine device 990 as the moving device based on the information obtained by the semiconductor device 930. Alternatively, the apparatus 9191 may be a medical apparatus such as an endoscope, a measurement apparatus such as a ranging sensor, an analysis apparatus such as an electronic microscope, an office apparatus such as a copier, or an industrial apparatus such as a robot.

According to the above-described exemplary embodiment, it is possible to obtain excellent pixel characteristics. Accordingly, it is possible to enhance the value of the semiconductor device. The enhancement of the value used herein corresponds to at least any of addition of a function, improvement of performance, improvement of characteristics, improvement of reliability, improvement of manufacturing yield, reduction of environmental load, cost reduction, downsizing, and weight saving.

Thus, when the semiconductor device 930 according to the present exemplary embodiment is used for the apparatus 9191, it is also possible to improve the value of the apparatus. For example, the semiconductor device 930 can be mounted on the transportation apparatus to obtain excellent performance when outside of the transportation apparatus is imaged or when an external environment is measured. For this reason, in manufacturing and selling the transportation apparatus, determination that the semiconductor device according to the present exemplary embodiment is mounted on the transportation apparatus is advantageous to enhancement in performance of the transportation apparatus itself. In particular, the semiconductor device 930 is suitable for the transportation apparatus that performs operation assistant and/or automatic operation of the transportation apparatus by using the information obtained by the semiconductor device.

A photoelectric conversion system and a moving body according to the present exemplary embodiment are to be described with reference to FIGS. 14B and 14C.

FIG. 14B illustrates an example of a photoelectric conversion system relating to an on-vehicle camera. A photoelectric conversion system 8 includes a photoelectric conversion device 80. The photoelectric conversion device 80 is the photoelectric conversion device (imaging device) described in any of the above-described exemplary embodiments. The photoelectric conversion system 8 includes an image processing unit 801 that performs image processing on a plurality of pieces of image data acquired by the photoelectric conversion device 80, and a parallax acquisition unit 802 that calculates parallax (phase difference of parallax images) from the plurality of pieces of image data acquired by the photoelectric conversion system 8. The photoelectric conversion system 8 includes a distance acquisition unit 803 that calculates a distance to an object based on the calculated parallax, and a collision determination unit 804 that determines whether a collision may occur based on the calculated distance. Each of the parallax acquisition unit 802 and the distance acquisition unit 803 is an example of a distance information acquisition unit for acquiring information on the distance to the object. In other words, the distance information is information about the parallax, a defocusing amount, the distance to the object, and the like. The collision determination unit 804 may determine the collision possibility by using any piece of the distance information. The distance information acquisition unit may be realized by hardware specially designed, or a software module. The distance information acquisition unit may be realized by a field programmable gate array (FPGA), ASIC, or a combination thereof.

The photoelectric conversion system 8 is connected to a vehicle information acquisition device 810, and can acquire vehicle information such as a vehicle speed, a yaw rate, and a steering angle. The photoelectric conversion system 8 is connected to a control electronic control unit (ECU) 820 that is a control device (control unit) configured to output a control signal for causing the vehicle to generate braking force, based on a determination result of the collision determination unit 804. The photoelectric conversion system 8 is also connected to an alert device 830 configured to issue an alert to a driver based on the determination result of the collision determination unit 804. For example, in a case where the collision possibility is high as the determination result of the collision determination unit 804, the control ECU 820 performs vehicle control to avoid collision or reduce damage by applying a brake, moving back an accelerator, suppressing engine output, or the like. The alert device 830 issues an alert to a user by sounding an alert such as sound, displaying alert information on a screen of a car navigation system or the like, vibrating a seat belt or a steering wheel, or the like.

In the present exemplary embodiment, the photoelectric conversion system 8 images surroundings of the vehicle, for example, a front side or a rear side.

FIG. 14C illustrates the photoelectric conversion system in a case where the front side (imaging range 850) of the vehicle is to be imaged. The vehicle information acquisition device 810 transmits an instruction to the photoelectric conversion system 8 or the photoelectric conversion device 80. Such a configuration makes it possible to further improve accuracy of ranging.

Although the example of the control for avoiding collision with another vehicle is described above, the present exemplary embodiment is applicable to automatic driving control for following another vehicle, automatic driving control for not going out of a traffic lane, or the like. Further, the photoelectric conversion system is applicable to a moving body (moving apparatus) such as a vessel, an airplane, and an industrial robot without being limited to a vehicle such as an own vehicle. In addition, the photoelectric conversion system is widely applicable to an apparatus that utilizes object recognition, such as an intelligent transportation system (ITS), without being limited to a moving body.

The disclosure is not limited to the above-described exemplary embodiments, and can be variously modified.

For example, the exemplary embodiments of the disclosure include an example in which a part of the configuration of one of the exemplary embodiments is added to another exemplary embodiment, and an example in which a part of the configuration of one of the exemplary embodiments is replaced with a part of the configuration of another exemplary embodiment.

The apparatus (photoelectric conversion system) described in each of the above-described exemplary embodiments is an example of the photoelectric conversion system to which the photoelectric conversion device may be applied, and the photoelectric conversion system to which the photoelectric conversion device of the disclosure can be applied is not limited to the configurations illustrated in FIGS. 14A to 14C.

The disclosure is not limited to the above-described exemplary embodiments, and can be variously modified. For example, the exemplary embodiments of the disclosure include an example in which a part of the configuration of one of the exemplary embodiments is added to another exemplary embodiment, and an example in which a part of the configuration of one of the exemplary embodiments is replaced with a part of the configuration of another exemplary embodiment. The disclosed contents of the present specification include not only matters described in the present specification but also all matters that can be grasped from the present specification and the accompanying drawings.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-091513, filed Jun. 6, 2022, which is hereby incorporated by reference herein in its entirety.

What is claimed is:
1. A photoelectric conversion device comprising:
a first substrate including, in a first semiconductor layer, a photoelectric conversion unit and a transfer transistor configured to transfer charges generated in the photoelectric conversion unit;
a second substrate including, in a second semiconductor layer, a pixel circuit configured to output a signal based on the charges transferred from the transfer transistor; and
a third substrate including, in a third semiconductor layer, a logic circuit configured to process the signal,
wherein the first substrate, the second substrate, and the third substrate are stacked in such a way that the second substrate is disposed between the first substrate and the third substrate, wherein the first substrate and the second substrate are electrically connected by a through wiring line penetrating through an insulator included in the second semiconductor layer, and wherein a plane orientation of the first semiconductor layer and a plane orientation of the second semiconductor layer are same as each other.

2. The photoelectric conversion device according to claim 1, wherein the first substrate and the second substrate are stacked in such a way that a first crystal direction of the first semiconductor layer and the first crystal direction of the second semiconductor layer are same as each other.

3. The photoelectric conversion device according to claim 1, wherein the first substrate and the second substrate are stacked in such a way that a first crystal direction of the first semiconductor layer and the first crystal direction of the second semiconductor layer are different from each other.

4. The photoelectric conversion device according to claim 3, wherein an angle formed by the first crystal direction of the second semiconductor layer and a direction in which a source and a drain of a transistor included in the pixel circuit are arranged is more than 30 degrees and less than 60 degrees.

5. The photoelectric conversion device according to claim 1, wherein a plane orientation of the third semiconductor layer and a plane orientation of the second semiconductor layer are same as each other.

6. The photoelectric conversion device according to claim 5, wherein the second substrate and the third substrate are stacked in such a way that a first crystal direction of the second semiconductor layer and the first crystal direction of the third semiconductor layer are same as each other.

7. The photoelectric conversion device according to claim 5, wherein the second substrate and the third substrate are stacked in such a way that a first crystal direction of the second semiconductor layer and the first crystal direction of the third semiconductor layer are different from each other.

8. The photoelectric conversion device according to claim 7, wherein an angle formed by the first crystal direction of the third semiconductor layer and a direction in which a source and a drain of a transistor included in the logic circuit are arranged is more than 30 degrees and less than 60 degrees.

9. The photoelectric conversion device according to claim 1, wherein each of the plane orientation of the first semiconductor layer and the plane orientation of the second semiconductor layer is (100).

10. The photoelectric conversion device according to claim 1, wherein each of the plane orientation of the first semiconductor layer and the plane orientation of the second semiconductor layer is (110).

11. The photoelectric conversion device according to claim 2, wherein each of the plane orientation of the first semiconductor layer and the plane orientation of the second semiconductor layer is (100), and each of the first crystal direction of the first semiconductor layer and the first crystal direction of the second semiconductor layer is <100>.

12. The photoelectric conversion device according to claim 2, wherein each of the plane orientation of the first semiconductor layer and the plane orientation of the second semiconductor layer is (110), and each of the first crystal direction of the first semiconductor layer and the first crystal direction of the second semiconductor layer is <110>.

13. The photoelectric conversion device according to claim 1, wherein a first wiring layer is provided between the first semiconductor layer and the second semiconductor layer, wherein a second wiring layer is provided between the second semiconductor layer and the third semiconductor layer, wherein a third wiring layer is provided between the second wiring layer and the third semiconductor layer, wherein the first wiring layer includes an interlayer insulation film, and wherein the through wiring line penetrates through the interlayer insulation film.

14. A photoelectric conversion system comprising:

the photoelectric conversion device according to claim 1; and a signal processing unit configured to generate an image by using a signal output from the photoelectric conversion device.

15. A moving body including the photoelectric conversion device according to claim 1, the moving body comprising:

a control unit configured to control movement of the moving body by using a signal output from the photoelectric conversion device.

* * * * *